US009252053B2

(12) United States Patent
Orozco-Teran et al.

(10) Patent No.: US 9,252,053 B2
(45) Date of Patent: Feb. 2, 2016

(54) SELF-ALIGNED CONTACT STRUCTURE

(71) Applicant: International Business Machines Corporation, Armonk, NY (US)

(72) Inventors: Rosa A. Orozco-Teran, Wappingers Falls, NY (US); Ravikumar Ramachandran, Pleasantville, NY (US); John A. Fitzsimmons, Poughkeepsie, NY (US); Russell H Arndt, Fishkill, NY (US); David L. Rath, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 14/157,125

(22) Filed: Jan. 16, 2014

(65) Prior Publication Data

US 2015/0200137 A1    Jul. 16, 2015

(51) Int. Cl.
    *H01L 21/768*    (2006.01)
    *H01L 29/49*    (2006.01)
    *H01L 29/45*    (2006.01)
    *H01L 21/28*    (2006.01)

(52) U.S. Cl.
    CPC .... *H01L 21/76897* (2013.01); *H01L 21/28079* (2013.01); *H01L 21/76805* (2013.01); *H01L 21/76816* (2013.01); *H01L 21/76831* (2013.01); *H01L 21/76877* (2013.01); *H01L 29/45* (2013.01); *H01L 29/4958* (2013.01)

(58) Field of Classification Search
    CPC .......... H01L 21/76897; H01L 21/76831; H01L 21/76816; H01L 21/76805; H01L 21/76877; H01L 29/45; H01L 21/28079
    See application file for complete search history.

(56) References Cited

U.S. PATENT DOCUMENTS

| | | | |
|---|---|---|---|
| 5,780,363 A | | 7/1998 | Delehanty et al. |
| 5,849,604 A | * | 12/1998 | Sugawara et al. ............... 438/30 |
| 6,597,067 B1 | | 7/2003 | Biery et al. |
| 6,630,074 B1 | | 10/2003 | Rath et al. |
| 2010/0289997 A1 | * | 11/2010 | Suzuki .......................... 349/158 |
| 2012/0139061 A1 | * | 6/2012 | Ramachandran et al. .... 257/410 |

* cited by examiner

*Primary Examiner* — Yasser A Abdelaziez
*Assistant Examiner* — Farun Lu
(74) *Attorney, Agent, or Firm* — Steven J. Meyers; Hoffman Warnick LLC

(57) ABSTRACT

Embodiments of present invention provide a method of forming a semiconductor structure. The method includes forming a semiconductor structure having a first metal layer and a plurality of dielectric layers on top of the first metal layer; creating one or more openings through the plurality of dielectric layers to expose the first metal layer underneath the plurality of dielectric layers; causing the one or more openings to expand downward into the first metal layer and expand horizontally into areas underneath the plurality of dielectric layers; applying a layer of lining material in lining sidewalls of the one or more openings inside the plurality of dielectric layers; and filling the expanded one or more openings with a conductive material.

21 Claims, 13 Drawing Sheets

SELF-ALIGNED CONTACT STRUCTURE

FIELD OF THE INVENTION

The present invention relates generally to the field of semiconductor device manufacturing and in particular relates to method of forming self-aligned metal structure such as contact structure and the structure formed thereby.

BACKGROUND

It has been observed that there is an increase in overall resistance when multiple contacts are formed in a series of constructions such as in a continuing chain of connections, in a stack of contacts on top of each other, and/or a combination thereof. It has also been confirmed that the increase in resistance is related mainly to large interfacial contact resistance. For example, aluminum oxide surfaces or films formed on top of aluminum contact structure have been most notably demonstrated to exacerbate this behavior of causing increased resistance in the overall metal structure formed thereby.

In order to combat and/or mitigate this increase in resistance, several approaches have been tested and/or developed. For example, one typical approach adopts to remove the oxide film at the interfacial surface and to make direct contact to the surface of bulk metal underneath. However as is known in the art, even though this approach may remove the oxidized surface film, it nevertheless does not address the likelihood of re-oxidation of the metal surface underneath before the completion of the process of forming the contact. Even during in-situ removal of surface contaminants such as metal-oxide in a vacuum system, residual atmosphere may still promote formation of undesired films. On the other hand, an ex-situ cleaning process may suffer from poor uniformity of an oxidized surface layer, and as such the varying depth of oxidative surface products may require excessive cleaning, which in turn may be destructive to other structures such as dielectric surfaces during a non-selective excessive clean step that is required to assure a clean surface.

SUMMARY OF EMBODIMENTS OF THE INVENTION

Embodiments of present invention provide a method of forming self-aligned metal structure. The method may include depositing a self-aligned contact enhancement layer to minimize re-growth, after surface cleaning, of native surface oxide film in a process of forming multiple stacked contacts. More specifically, one embodiment may include forming the self aligned contact enhancement layer to have a much larger surface area in intimate contact with the main metallurgy than a normal contact connection could have due to design limitations of normal contact construction. Consequently, any contribution of an interfacial oxide film may be diminished substantially by the increased inter-metallic contact surface area.

Embodiments of present invention further includes the use of an etchant that selectively removes both surface oxide and at least a portion of the bulk metal underneath the surface oxide, along the lateral dimension of the metal structure such that a large surface area connection is constructed whilst still maintaining dimensional ground-rules. The self-aligned contact enhancement layer or structure is constructed of a material that forms intimate electrical contact with the bulk metallurgy structure and is more stable to re-oxidation than the bulk metal. Alternatively, the self-aligned contact enhancement layer or structure may be constructed of a material that forms intimate electrical contact with the bulk metallurgy structure, and may be deposited in such a manner that re-oxidation of the surface of the self-aligned contact enhancement layer or structure is obviated during deposition of the layer by performing deposition within a containment structure.

Specifically, embodiments of present invention provide a method of forming semiconductor structure. The method includes forming a semiconductor structure having a metal layer and one or more dielectric layers on top of the metal layer; creating one or more via holes through the one or more dielectric layers to expose the metal layer underneath the one or more dielectric layers; causing the one or more via holes to expand into the metal layer and horizontally into areas underneath the one or more dielectric layers; and filling the expanded via holes with a conductive material.

According to one embodiment, causing the one or more via holes to expand includes applying an isotropic etching process to etch the exposed metal layer, wherein the isotropic etching process is selective to the one or more dielectric layers.

According to another embodiment, etching the exposed metal layer includes causing a non-metal layer underneath the metal layer being exposed.

According to yet another embodiment, etching the exposed metal layer includes causing a substantial amount of the metal layer being removed, thereby exposing a substantial portion of the non-metal layer underneath the metal layer.

Embodiments of present invention further includes applying a layer of lining material onto sidewalls of the via holes that are formed inside the one or more dielectric layers by use of a metal deposition technique that is compatible with the semiconductor construction. Commonly used processes may include: physical vapor deposition (PVD) process, chemical vapor deposition (CVD) process, or plasma enhanced chemical vapor deposition process (PECVD).

In one embodiment, applying the layer of lining material includes applying a layer of material wherein the material being selected from a group consisting of titanium-nitride (TiN), titanium-tungsten (TiW), tantalum (Ta), tantalum-nitride (TaN), tungsten-nitride (WN), cobalt (Co), cobalt alloys, ruthenium (Ru), and ruthenium alloys.

In another embodiment, the conductive material contacts the remaining of the metal layer underneath the one or more dielectric layers, the conductive material forms an interface with the remaining of the metal layer that is larger than a cross section of the via holes.

In yet another embodiment, the conductive material that are filled into two of the expanded via holes contact each other underneath the one or more dielectric layers.

According to one embodiment, the metal layer is an aluminum gate of a transistor embedded inside the one or more dielectric layers.

BRIEF DESCRIPTION OF THE DRAWINGS

The present invention will be understood and appreciated more fully from the following detailed description of preferred embodiments, taken in conjunction with the accompanying drawings of which.

Figure 1:
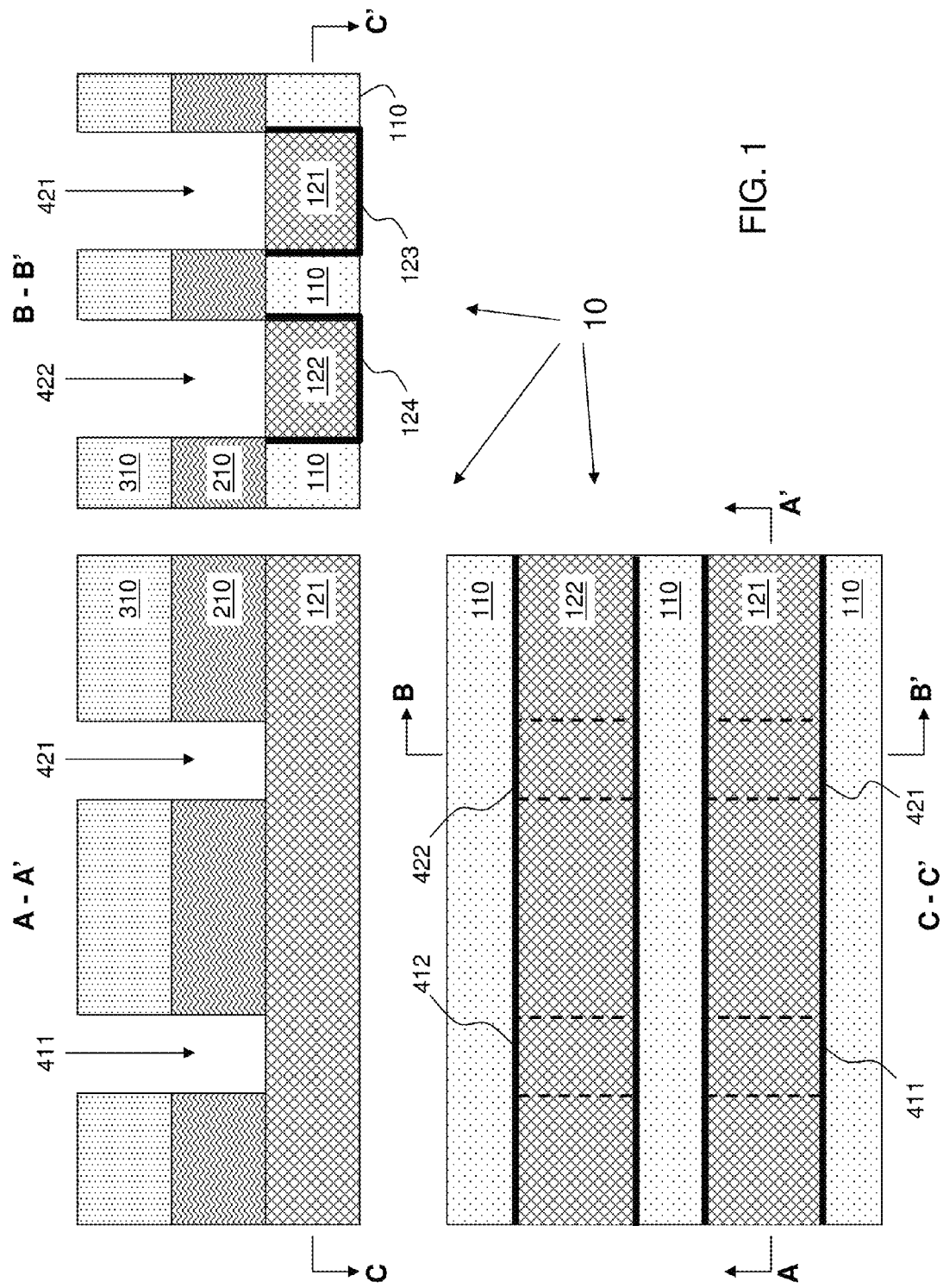
FIGS. 1-4 are demonstrative illustrations of steps of a method of forming self-aligned contact structure according to one embodiment of present invention.

It will be appreciated that for purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF EMBODIMENTS OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

Embodiments of present invention may be applied to one or more construction points of a semiconductor device build where structure of the semiconductor device may benefit from a selective recess of a prior existing metal construction and where the structure is resistive to the etchant used to recess the metal. One common example is in recessing a metal in a dielectric structure that has a differential etch rate from the metal construction therein. Metals that are commonly used in the metal construction may include, in back-end-of-line (BEOL) technology, copper (Cu), copper alloys, tungsten (W), tungsten alloys, aluminum (Al), and aluminum alloys wherein the alloying agents may be any other metal or metals (for examples transition and lanthanide series metals). Other areas of potential application in the semiconductor device build process may include at the transition point from front-end-of-line (FEOL) to the BEOL, which sometimes may be referred to as middle-of-line (MOL). In the MOL, the transition from FEOL to BEOL often involves the construction of metal gate structures FIGS. 1-4 are demonstrative illustrations of steps of a method of forming self-aligned contact structure according to one embodiment of present invention. More specifically, FIGS. 1-4 illustrate a self-aligned contact structure under manufacturing including, respectively, a first cross-sectional view taken at a position A-A'; a second cross-sectional view taken at a position B-B' that is 90-degree rotated from position A-A'; and top-view taken at a position C-C'. The self-aligned contact structure is illustrated merely as a demonstrative example of various applications of present invention and, as being described above, applications of present invention are not limited in the aspects shown in FIGS. 1-4.

For example, in FIG. 1, it is illustrated a self-aligned metal structure such as a contact structure 10 that may be formed to contact one or more gates of one or more transistors. In the demonstrative example illustrated in FIG. 1, contact structure 10 may be formed to have one or more gates such as a first gate 121 and a second gate 122, which may be metal gate and may be constructed from, for example, aluminum, tungsten, and/or titanium nitride (TiN), to list only a few of many demonstrative examples of materials. Hereinafter, for the ease of description without losing generality, gate 121 and gate 122 may be described as metal gate 121 and metal gate 122 that are constructed from aluminum.

Although 121 and 122 are described as metal gates in embodiments described hereinafter, embodiments of present invention may be applied equally to other types of metal structures and by no means are limited to gate contact structures. For example, 121 and 122 may be metal interconnects in another embodiment such as in a BEOL structure, and in such embodiment metal interconnects 121 and 122 may be formed on top of, for example, other metal interconnects and/or middle-of-line (MOL) structures. Description similar to those provided below may equally be applied to such metal interconnects 121 and 122.

First aluminum gate 121 and second aluminum gate 122 may be formed inside or embedded in a dielectric layer 110, with a first diffusion barrier layer 123 around first gate 121 and a second diffusion barrier layer 124 around second gate 122. Diffusion barrier layers 123 and 124 help prevent dielectric layer 110 from being contaminated by aluminum gates 121 and 122, and isolate different gates from becoming electrically connected. Dielectric layer 110 and metal gates 121 and 122 may be formed on top of a semiconductor substrate and more specifically metal gates 121 and 122 may be formed on top of channel regions of their respective transistors. However, details of these channel regions and/or structures of the transistors are not shown in FIG. 1 in order not to obscure description of essence of present invention.

On top of the dielectric layer 110 and aluminum gates 121 and 122 there may be deposited a first dielectric layer 210 and a second dielectric layer 310, both of which may be known as inter-layer-dielectric (ILD) layers. Inside dielectric layers 210 and 310, one or more via holes (or openings) may be formed to expose underneath aluminum gates 121 and 122 in preparation for forming contacts to the gates. More specifically as being demonstratively illustrated in FIG. 1, via holes (or openings) 411 and 421 may be formed directly above aluminum gate 121 and via holes (or openings) 412 and 422 may be formed directly above aluminum gate 122.

Here, some explanations of the various cross-sectional views of the drawings are in order. In FIG. 1, as cross-section A-A' is taken horizontally at a location right across and along aluminum gate 121, cross-sectional view A-A' illustrates via holes 411 and 421 that are formed above aluminum gate 121. On the other hand, cross-section B-B' is taken vertically across both aluminum gates 121 and 122, and across via holes 421 and 422, thus cross-sectional view B-B' illustrates both via hole 421 and via hole 422 sitting on top of gate 121 and 122 respectively. In addition, aluminum gates 121 and 122 are illustrated to be embedded inside dielectric layer 110. Furthermore, top-view C-C' is taken in a plane that crosses over both dielectric layer 110 and aluminum gates 121 and 122. Therefore, top-view C-C' may illustrate aluminum gates 121 and 122 to be situated horizontally and embedded inside and separated by dielectric layer 110. In top-view C-C', via holes 411, 412, 421, and 422 are illustrated only to show their projected locations relative to gate 121 and 122. Via holes 411, 412, 421, and 422 in top-view C-C' are illustrated in dash lines to indicate that they would otherwise not be visible in cross-section view C-C'.

Figure 2:
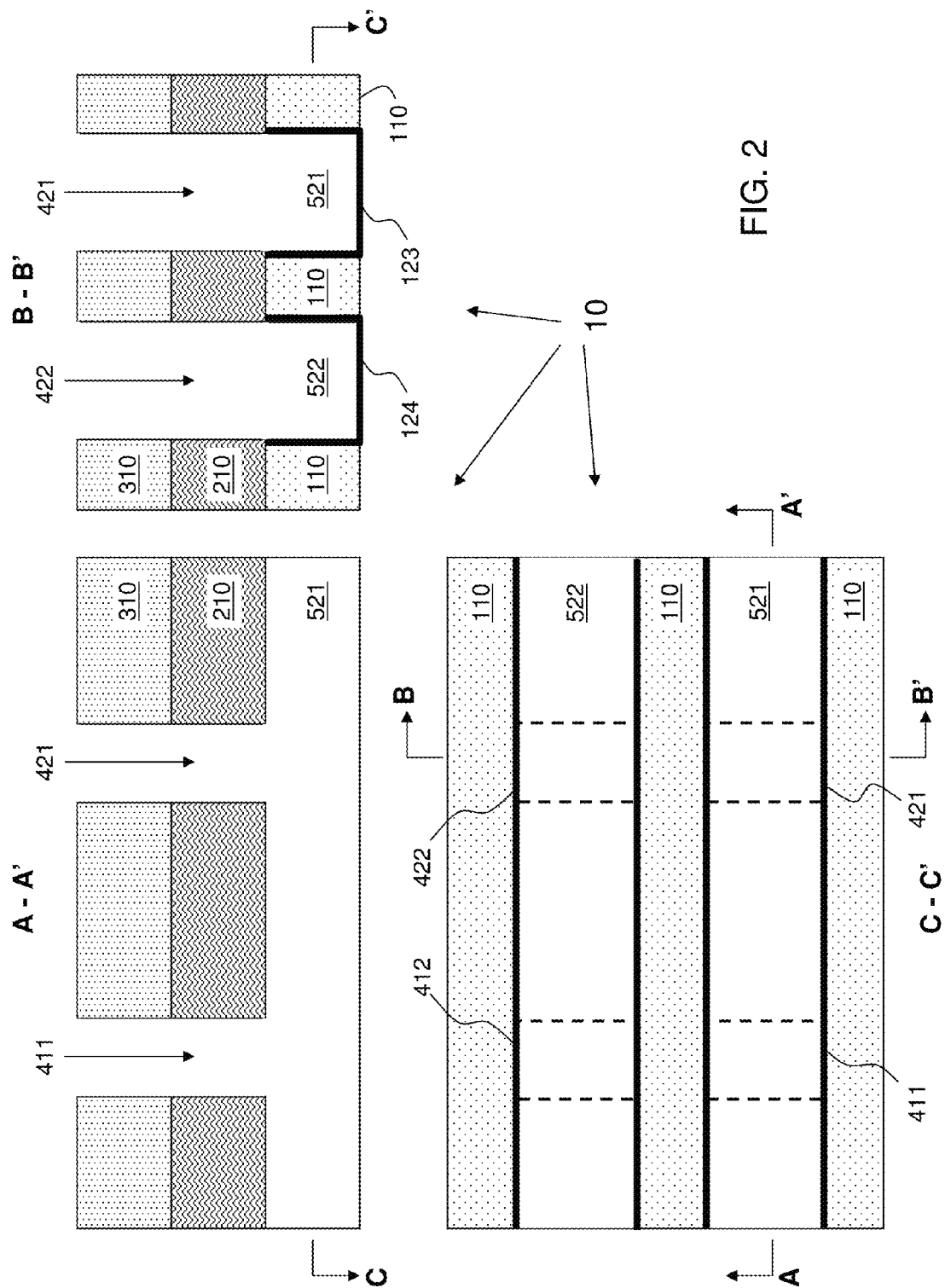

FIG. 2 demonstratively illustrates a step of a method of forming self-aligned contact structure 10 following the step illustrated in FIG. 1, according to one embodiment of present invention. More specifically, one embodiment of the method includes removing aluminum gates 121 and 122 and any oxide or oxide film that are formed on top thereof, through via holes or openings 411, 412, 421, and 422. Removing aluminum gates 121 and 122 may include applying an etchant in an isotropic etch process, such as a reactive-ion-etching (RIE) process, that is made selective to dielectric material such as material of ILD layer 210 and 310.

The selection of etchant may primarily be based upon achieving a goal that there is only limited or no etching of the materials of the surrounding dielectric constructions. In addition, using the selected etchant, the etching of metal gates 121 and 122 may be performed in a controlled manner. For example, in the cases of metal gates made of aluminum, tungsten, or copper, according to one embodiment, it is generally preferred to use an etchant composition of an acid and an oxidant and optionally with the addition of small amounts of fluoride ion. The oxidant and acid may be a single species such as nitric acid, or mixtures of oxidants and acids such as sulfuric acid and hydrogen peroxide. According to another embodiment, ratio of concentration between oxidant and acid may be balanced and/or adjusted such that a controlled etching of the metal gates may be achieved.

Figure 12:
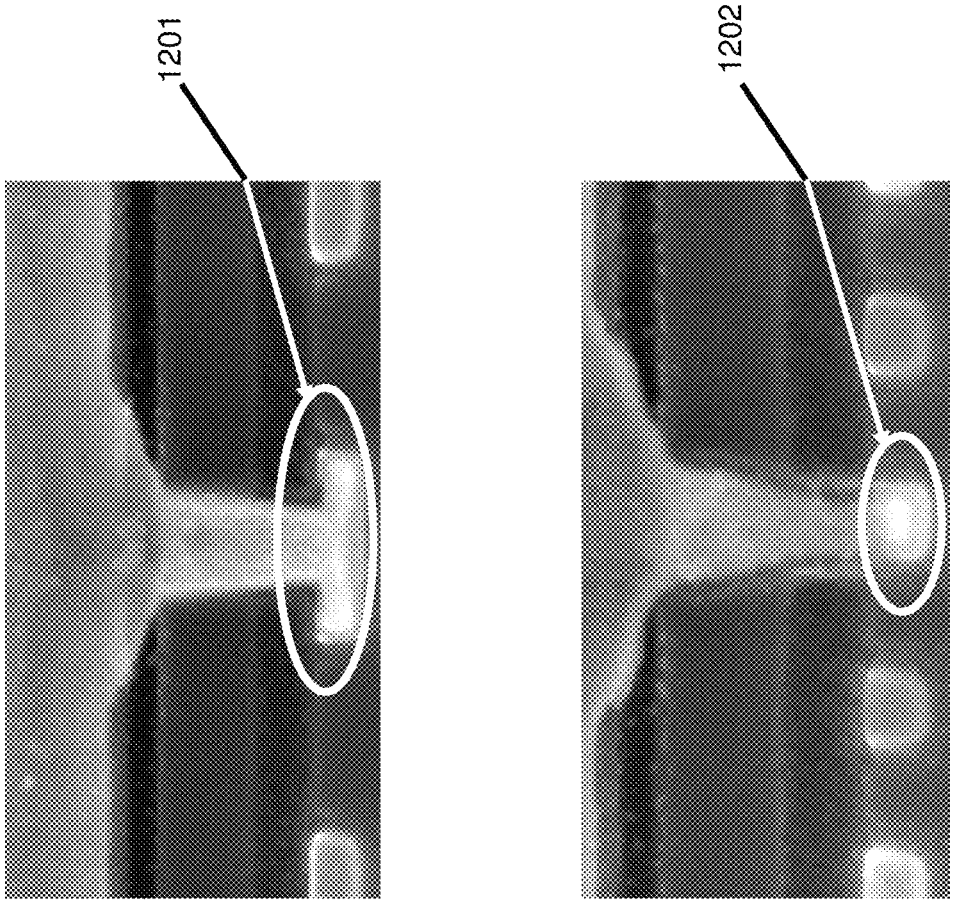
FIG. 12 are sample SEM pictures of self-aligned contact structures that are formed according to one embodiment of present invention.
Figure 13:
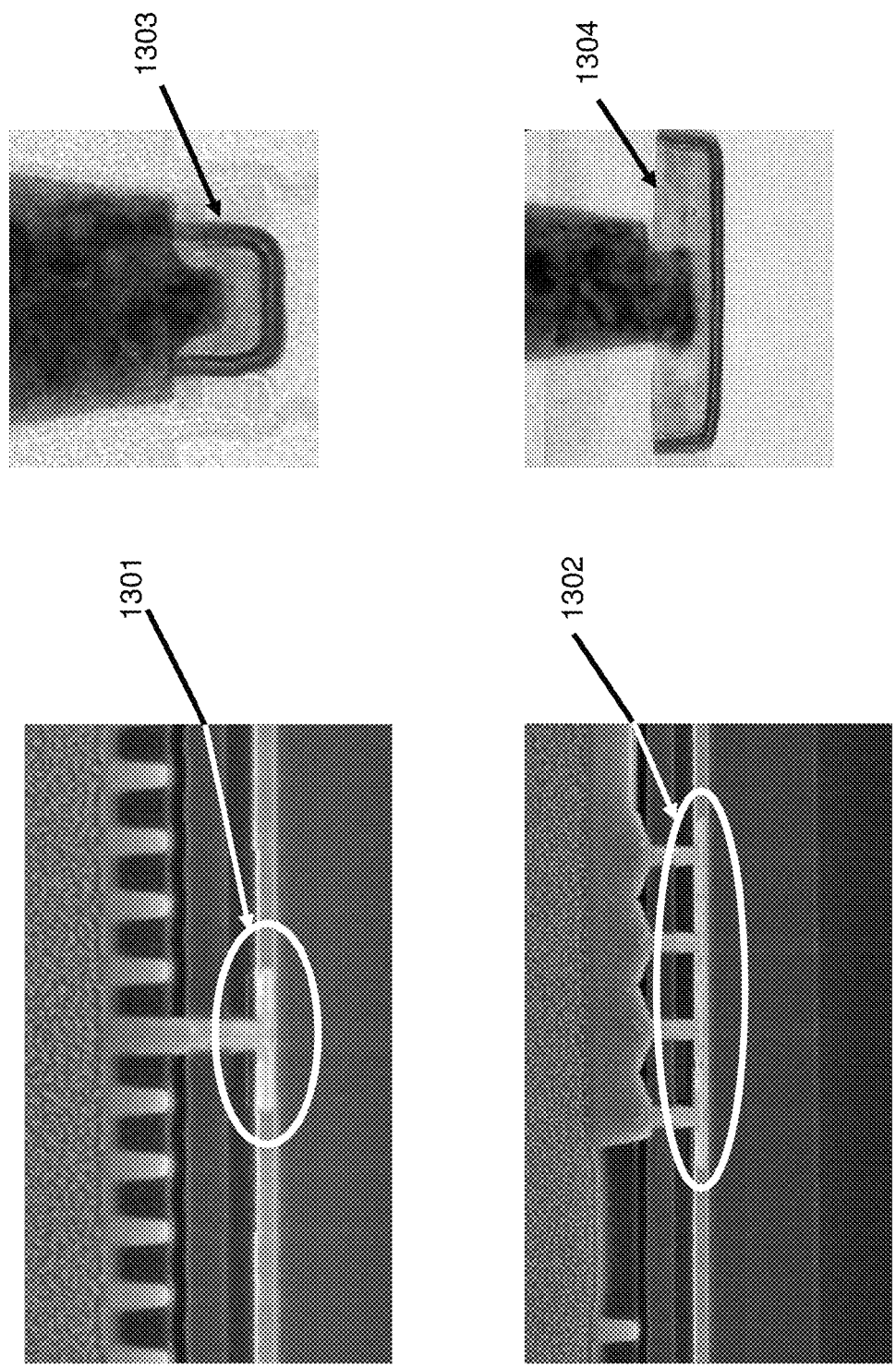
FIG. 13 are sample SEM pictures of self-aligned contact structures that are formed according to another embodiment of present invention.

The use of small amounts of fluoride ion may be employed when native oxides present certain level of resistance to chemical etching of the metal. As it is understood that fluoride ion can have activity with many dielectric materials, in one embodiment, the addition of fluoride ion may be judiciously controlled to be within a level that will not cause or induce undesired activity with respect to dielectric structures within the device construction. During the etching process, temperature and time duration may be used as additional fine adjustment parameters to control the extent of etch. In the specific samples of SEM pictures provided for the demonstration as illustrated in FIG. 12 and FIG. 13, a ternary mixture of sulfuric acid, hydrogen peroxide, and de-ionized water (used as a diluent to control concentration) with an addition of small amounts of fluoride ion was employed as the etchant. More specifically, the concentrations were approximately 20 parts of about 96% sulfuric acid, approximately 1 part of about 30% hydrogen peroxide, and approximately 380 parts de-ionized water with an addition of fluoride ion within the range of 100 to 500 ppm. The fabrication or experiment was conducted between room temperature (approximately 23 degrees Celsius) and 50 degrees Celsius and the time duration were between 30 seconds and 5 minutes. In one embodiment, the removal process of metal gates 121 and 122 may be made sufficient long such that after the removal all of gate materials 121 and 122, or at least a substantial portion of gate materials 121 and 122 may be removed leaving opening spaces 521 and 522 in areas where metal gates 121 and 122 were previously present.

Figure 3:
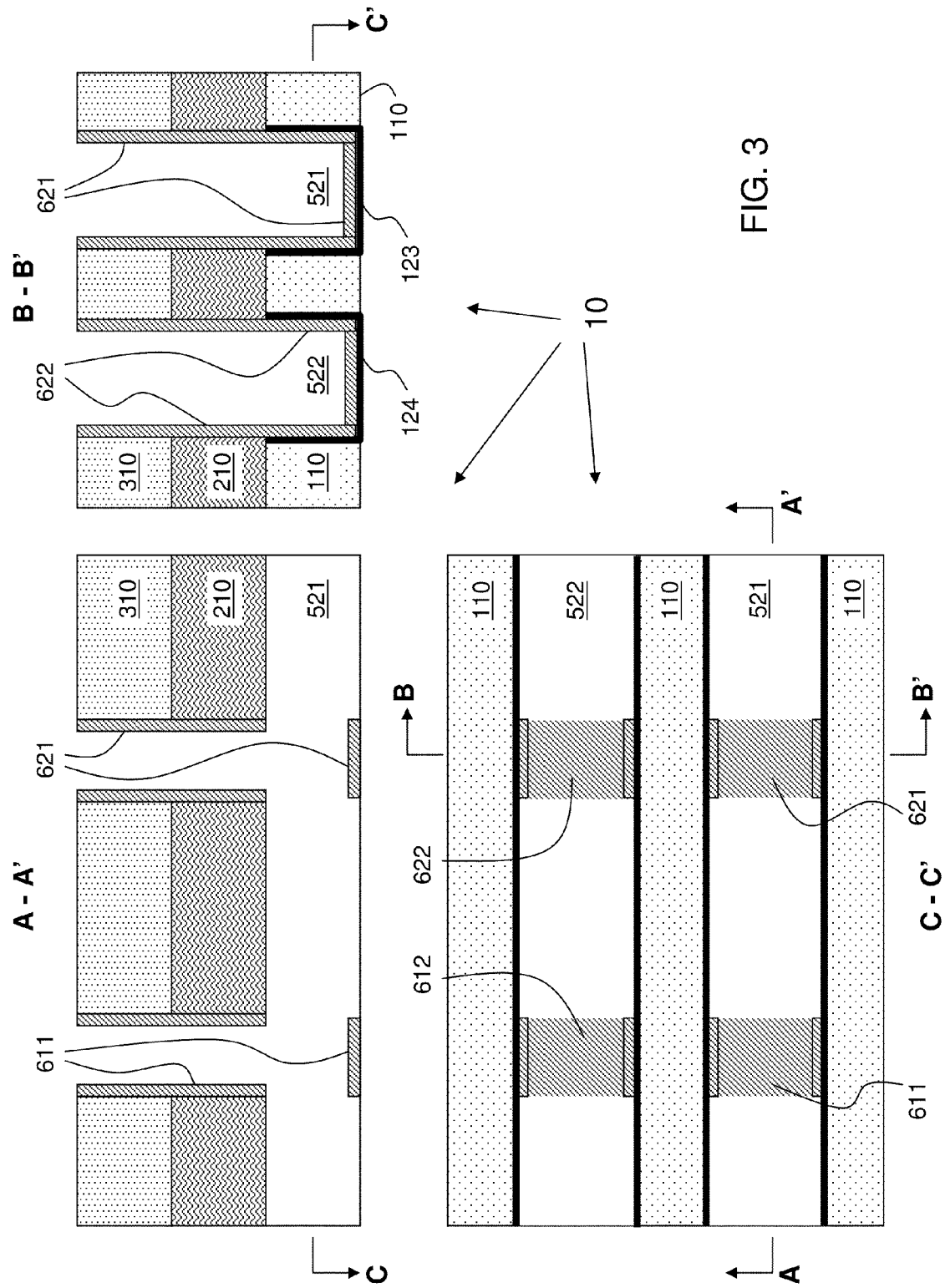

FIG. 3 demonstratively illustrates a step of a method of forming self-aligned contact structure 10 following the step illustrated in FIG. 2, according to one embodiment of present invention. After metal gates 121 and 122 have been removed, metal liners 611, 612, 621, and 622 may be applied to line via openings 411, 412, 421, and 422 respectively. Metal liners 611, 612, 621, and 622 may be deposited onto surfaces that are in the direct path of the deposition process and thus may be deposited onto sidewalls of via openings 411, 412, 421, and 422 as well as portions of bottom surface of opening spaces 521, and 522 that face substantially directly the via openings. For example, a directional deposition process, such as a physical vapor deposition (PVD) process, may be applied to deposit metal liners 611, 612, 621, and 622 to the respective via openings. Nevertheless, some culmination expansion may occur during the PVD process resulting in overspray of the liner material and thus the portion of metal liners at the bottom of via holes 411, 412, 421, and 422, which function as "apertures" during the PVD process, may be slightly bigger than areas that are directly exposed by these "apertures". Alternatively, methods such as chemical vapor deposition (CVD) or plasma enhanced chemical vapor deposition (PECVD) may be used if increased surface coverage by a liner is desired because both CVD and PECVD processes are known to be able to extend, to certain extent, deposition coverage to greater distances beyond that defined by an aperture opening.

When determining which deposition technique may be suitable or whether to employ certain technique in order to increase or maximize liner coverage, it is also important to consider that the application of a liner material may introduce additional resistive paths. Therefore, sometimes it may be desirable or proper to rather increase or maximize metal fill (first metal) to metal fill (second metal) contact areas, and in order to do so minimizing or reducing the amount of liner that is applied to cover the surface of the first metal, which may as a result increase or maximize direct contact areas of the first metal to the second metal.

Various metal liner materials may be used. Such materials may include, for example, titanium-nitride (TiN), titanium-tungsten (TiW), tantalum (Ta), tantalum-nitride (TaN), tungsten-nitride (WN), cobalt (Co), cobalt alloys, ruthenium (Ru), ruthenium alloys, and other transition metal, metal alloy, and/or metal-nitride that may function as a barrier having the property of preventing moisture and/or metal migration into surrounding dielectric material. The use of metal liners helps improve adhesiveness of subsequently deposited metal fill material; smooth the surfaces thereof, and reduce resistance.

Figure 4:
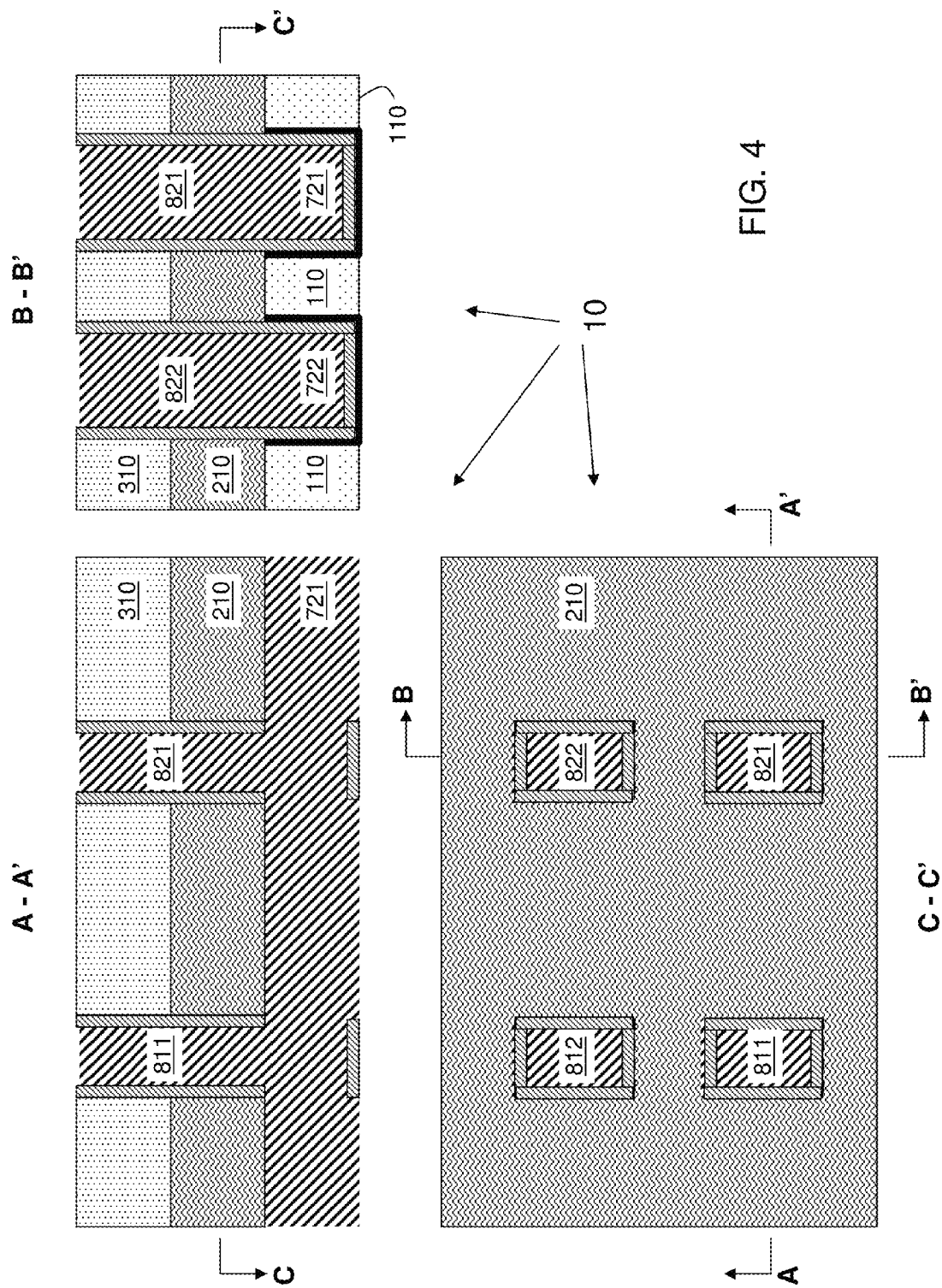
Figure 5:
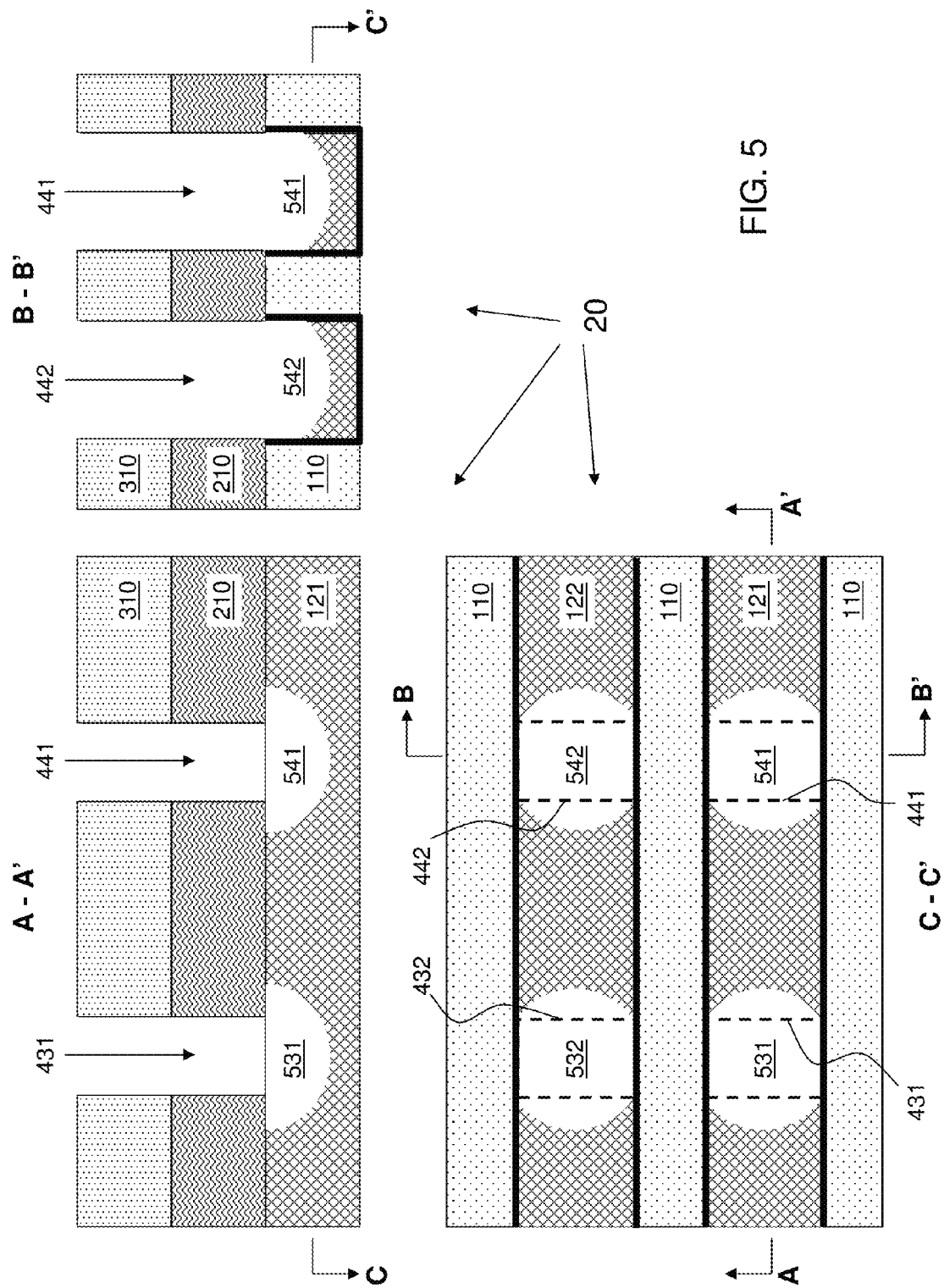
FIGS. 5-8 are demonstrative illustrations of steps of a method of forming self-aligned contact structure according to another embodiment of present invention.

FIG. 4 demonstratively illustrate a step of a method of forming self-aligned contact structure 10 following the step illustrated in FIG. 3, according to one embodiment of present invention. More specifically, embodiment of present invention includes performing metal fill into the opening spaces 521 and 522 to re-create metal gates 721 and 722, and continues to fill up via openings 411, 412, 421, and 422 to form contacts 811, 812, 821, and 822. Materials used in metal fill may include, but are not limited to, Cu, Al, W, Cr, Ag, alloys of these metals with transition and/or lanthanide series metals, and other suitable conductive material.

The metal fill process may be performed, for example, in a chemical vapor deposition (CVD) or plasma enhanced chemical vapor deposition (PECDV) process. Unlike a PVD process, a CVD process employs a carrier agent that carries the desired metal (to be deposited) or metal element. The metal or metal element may then be transported by this carrier agent to a surface, decompose from the carrier agent, and deposit onto the surface as metal. For example, through the above CVD process, tungsten (W) may be deposited by applying volatile gases such as $WF_6$ or $W(CO)_6$ as carrier agent. Typically, the deposition occurs under reduced pressure with high gas mobility and as such the gas may reach deep into recesses, as areas illustrated in FIG. 4 underneath dielectric layer 210, before decomposition and subsequent deposition happens. The formation of gates 721, 722 and gate contacts on top thereof 811, 812, 821, and 822 may be carried out in one single process thus avoiding creating any oxidized interface between them and thus reduces and/or eliminate any potential resistant issues relating to interfacial oxide. In some embodiments where metal gates (main metallurgy, known here as first metal) are not completely removed, as those demonstratively illustrated below, contact areas with the below main metallurgy (first metal) created through this process may increase which may result in lowered interfacial contact resistance between the first metal that remains and the second metal that is subsequently deposited.

FIGS. 5-8 are demonstrative illustrations of steps of a method of forming self-aligned contact structure according to another embodiment of present invention. For example, FIG. 5 demonstratively illustrates a step of forming contact structure 20 after via holes or via openings 431, 432, 441, and 442 have been made in dielectric layers 210 and 310. One embodiment of present invention includes etching and/or removing only a portion of underneath aluminum gates 121 and 122 to create recesses 531, 532, 541, and 542. Recesses 531, 532, 541, and 542 may be made to have a top area, at the interface with metal gates 121 and 122, that is larger than horizontal cross-sectional areas of via openings 431, 432, 441, and 442. In other words, etching of aluminum gates 121 and 122 may be an isotropic etching process, such as a wet etch process or a defused plasma etch process, that etches both vertically into gates 121 and 122 and horizontally underneath dielectric layer 210.

The extent of the cavity created by the etch process may be controlled to produce a cavity of desired size by using the selected etchant as being described above. In some instances, a minimal etch into the metal structure (or line structure) below may be desirable as is the embodiment illustrated here. In other instances, it may be desirable to substantially or even completely remove the buried metal structure or metal gate structure as is the embodiment demonstratively illustrated above with reference to FIGS. 1-4. Embodiments of present invention provide a method that enables a controlled variation between minimal etch and complete removal of the exposed metal gate structure, with the variation being tunable thus controlled by the selection of etchant composition, time duration, and temperature. In the embodiment illustrated in FIGS. 5-8, the etching process creates an interfacial cavity between the remaining of aluminum gates 121 and 122 and the opening spaces 531, 532, 541, and 542 that lead to via openings 431, 432, 441, and 442.

Figure 6:
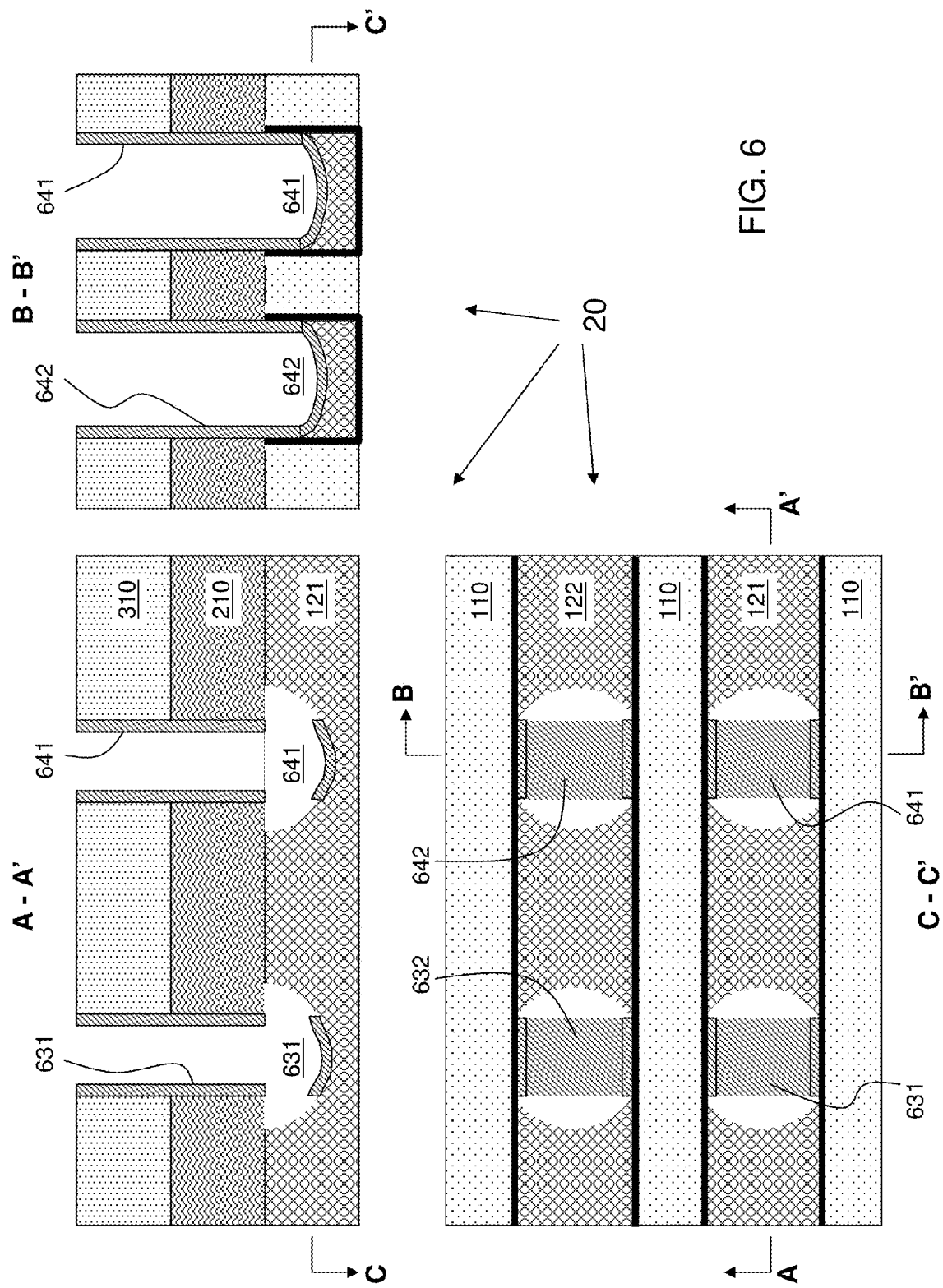

After the creation of recesses 531, 532, 541, and 542 into aluminum gates 121 and 122, metal liners 631, 632, 641, and 642 may be applied to line the surface of via openings 431, 432, 441, and 442 respectively, as being demonstratively illustrated in FIG. 6, to improve adhesiveness of subsequent metal fill. For example, a directional deposition process, such as the physical vapor deposition (PVD) process, may be applied to deposit metal liners 631, 632, 641, and 642. Material of metal liners may include, for example, TiN, TiW, Ta, TaN, WN, Co, cobalt alloys, Ru, ruthenium alloys, and other transition metal metals, alloys, or nitrides with barrier properties against moisture and metal migration into dielectric materials, and/or any other suitable material. In the PVD process, metal liners may be deposited onto surfaces that are in the direct path of material particles and thus may be deposited onto sidewalls of via hole or via openings 431, 432, 441, and 442 as well as portions of bottom surfaces of opening spaces 531, 532, 541, 542 that face directly or substantially the via openings. Areas of deposition to bottom surfaces may be slightly bigger than what are directly exposed by via openings 431, 432, 441, and 442 due to culmination expansion.

Alternatively, CVD or PECVD deposition methods may be used as well if increased surface coverage by the liner material is desired or preferred as these two deposition methods are known to be able to extend deposition coverage to greater distances beyond that which is simply defined by an aperture opening as in a PVD process. According to one embodiment of present invention, when determining or deciding whether it is proper to employ or use techniques that may help increase or maximize liner coverage it is also important to consider that a liner material may introduce additional resistive paths. Therefore, in instances it may be desired or better to increase or maximize metal fill to metal fill contact areas and decrease or minimize the amount of liner that covers the surface of the first metal. In other words, it may be better to increase the direct contact of the first metal (existing metal) to the second metal (metal to be deposited) by controlling the amount of liner applied. In the illustrated embodiment, a preferred approach may be to increase the first metal to second metal contact area and reduce the amount of surface area of the first metal that is covered by the liner metal.

Figure 7:
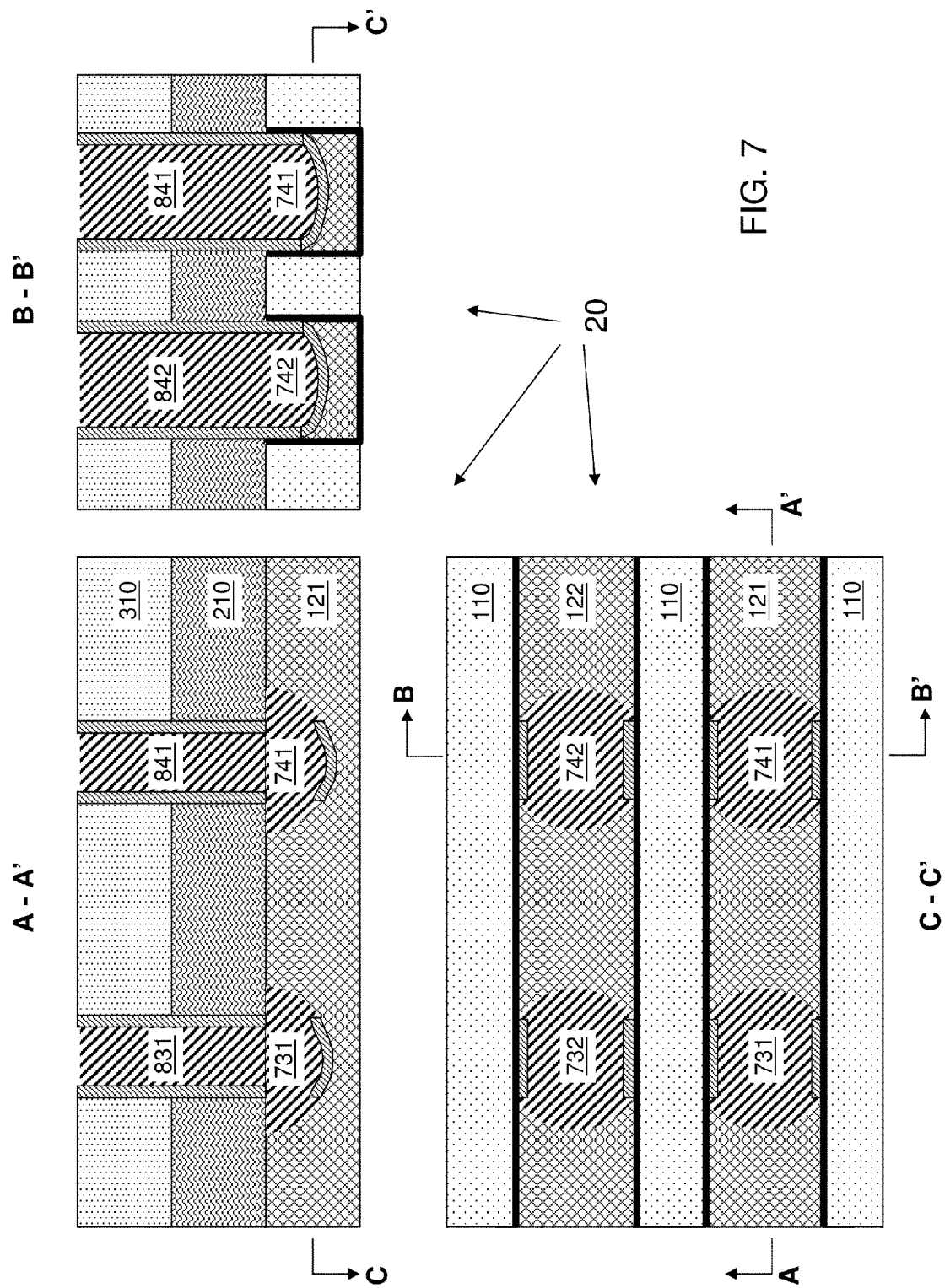

FIG. 7 demonstratively illustrate a step of a method of forming self-aligned contact structure 20 following the step illustrated in FIG. 6, according to one embodiment of present invention. More specifically, embodiment of present invention includes performing metal fill into the opening spaces 531, 532, 541, and 542 to create conductive studs 731, 732, 741, and 742 that connect to remaining portions of metal gates 121 and 122. One embodiment may continue to fill up via openings 431, 432, 441, and 442 to form contacts 831, 832, 841, and 842 that sit directly on top of and continue from conductive studs 731, 732, 741, and 742. Before performing the metal fill, one embodiment of present invention may include performing an initial reactive pre-cleaning process to reduce or remove possible metal oxides and clean the interface of opening spaces 531, 532, 541, and 542 with remaining metal gates 121 and 122. With the increased surface area of interfacial contact, the interfacial contact resistance may be reduced when being compared with an interfacial contact formed at a cross-section of contact areas 831, 832, 841, and 842 which has a much smaller cross-sectional area. According to one embodiment, different metals may be used as replacement metal fill, and such metals may have the properties of increased conductivity, with respect to the metal that was removed from the metal gate, reduced behavior of forming resistive metal oxide, and/or improved ease of metal oxide reduction.

Figure 8:
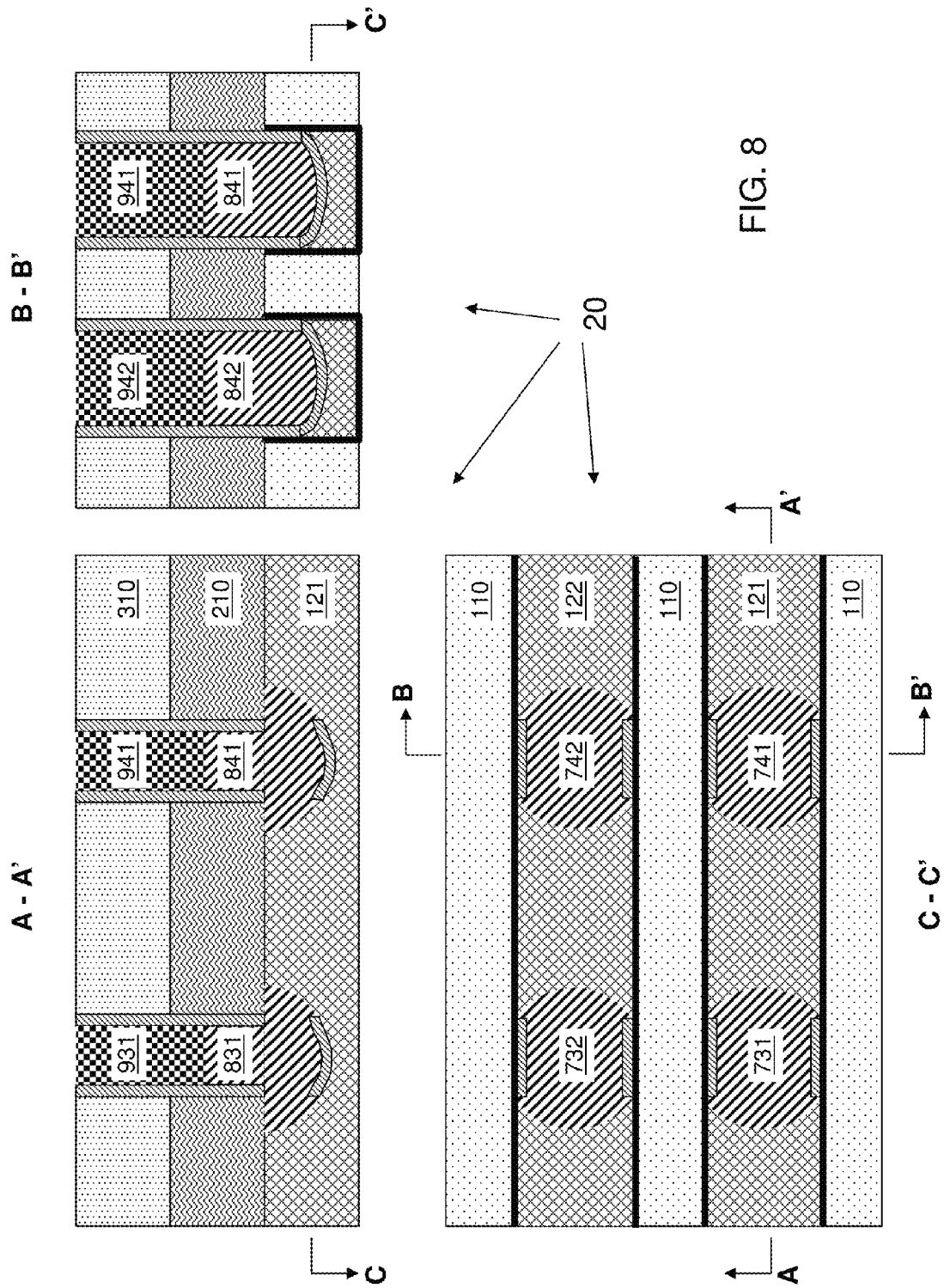

FIG. 8 demonstratively illustrates another embodiment of present invention. More specifically, embodiment of present invention may include depositing different conductive and/or metal material into via openings 431, 432, 441, and 442 and underneath opening spaces 531, 532, 541, and 542. For example, tungsten (W) may first be used to fill up opening spaces 531, 532, 541, and 542 directly above aluminum gates 121 and 122 to form conductive studs 731, 732, 741, and 742, and a lower portion of gate contacts 831, 832, 841, and 842. Subsequently, material of replacement metal fill may be switched to copper (Cu) which is then deposited on top of tungsten to for an upper portion of gate contacts 931, 932, 941, and 942. The combination of gate contacts 831 with 931, 832 with 932, 841 with 941, and 842 with 942 provides a better conductivity by, in addition to reduced contact resistance, reducing the total combined bulk resistivity of the resulting structure.

Figure 9:
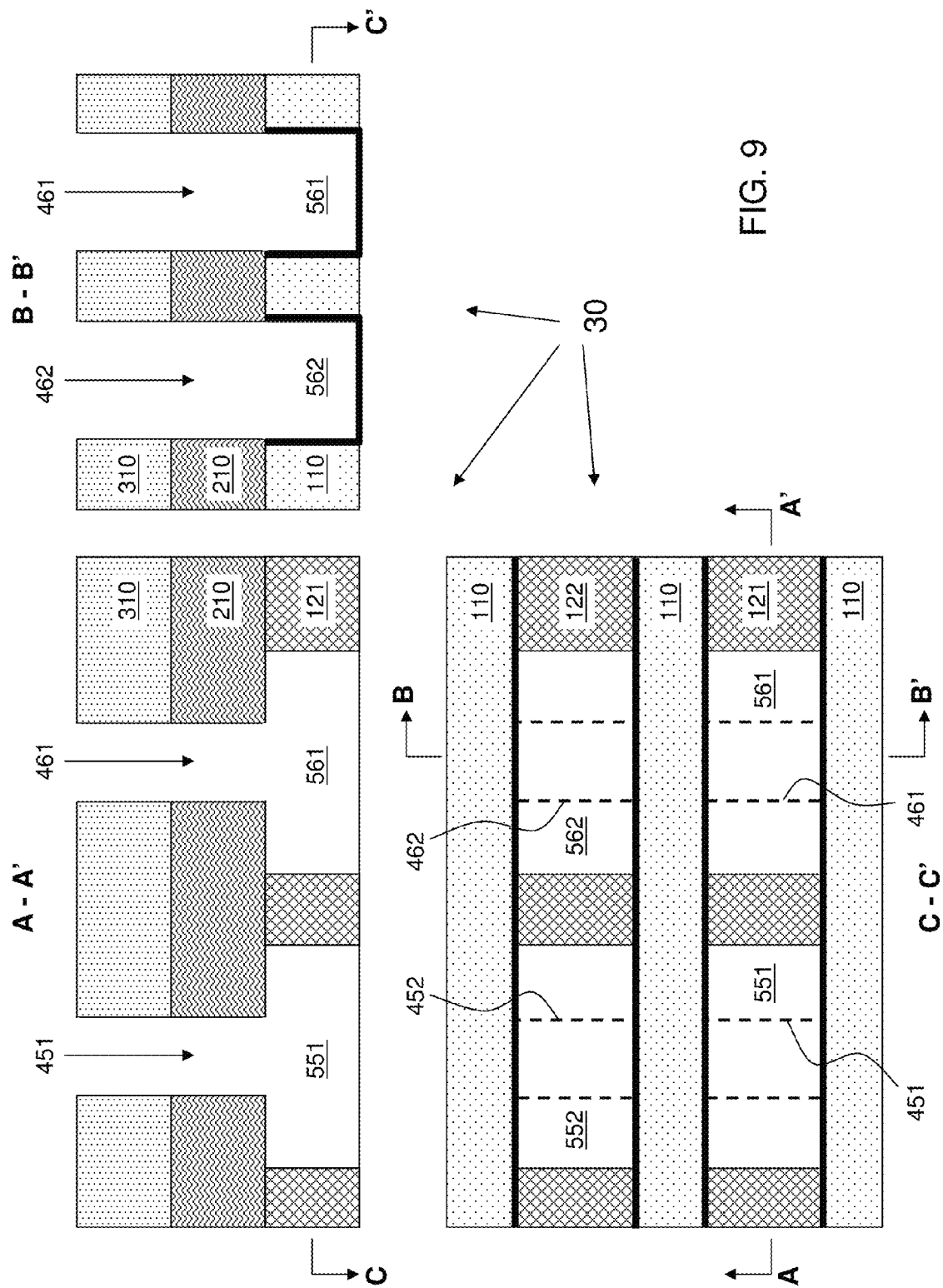
FIGS. 9-11 are demonstrative illustrations of steps of a method of forming self-aligned contact structure according to yet another embodiment of present invention.
Figure 10:
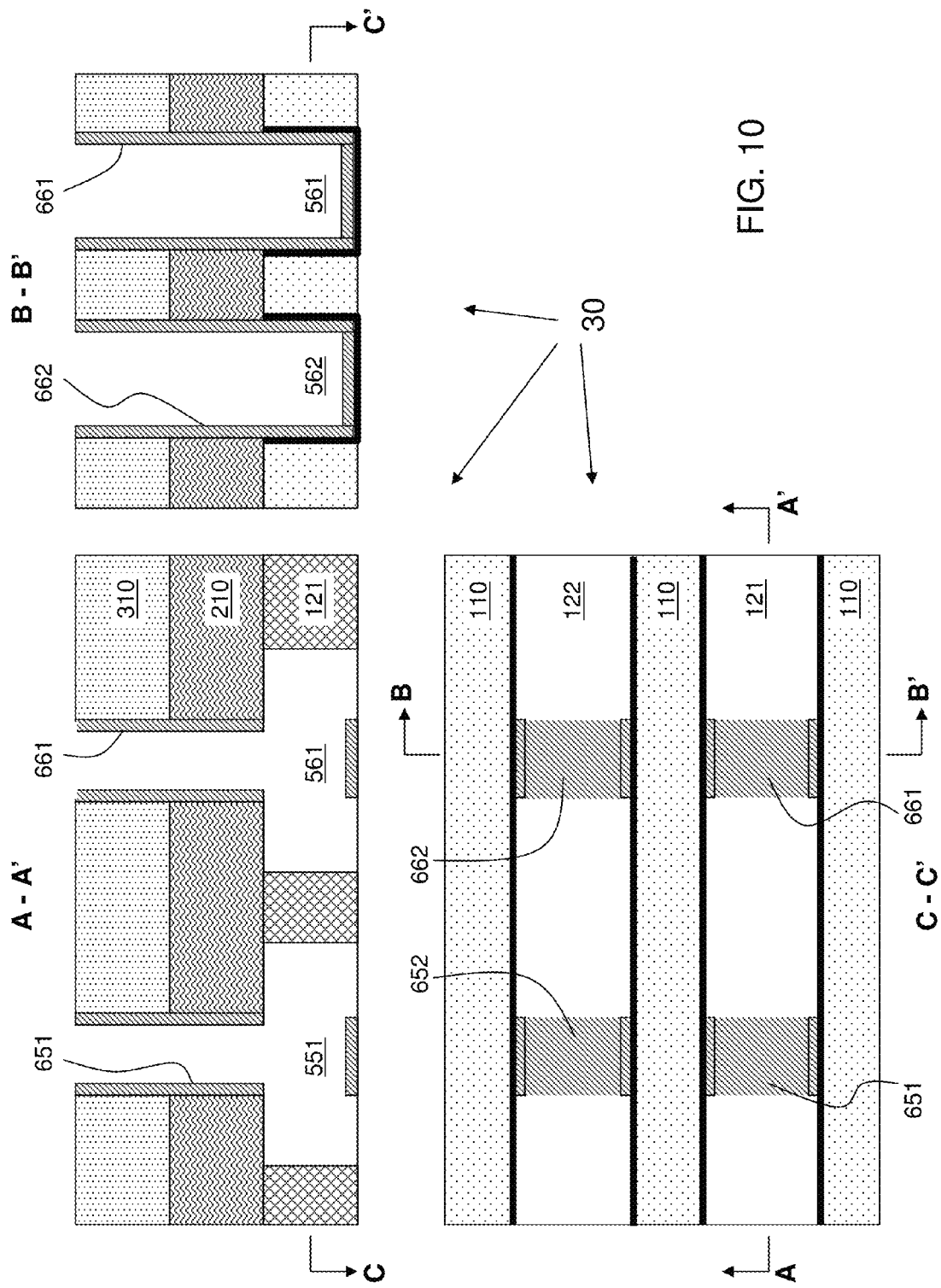
Figure 11:
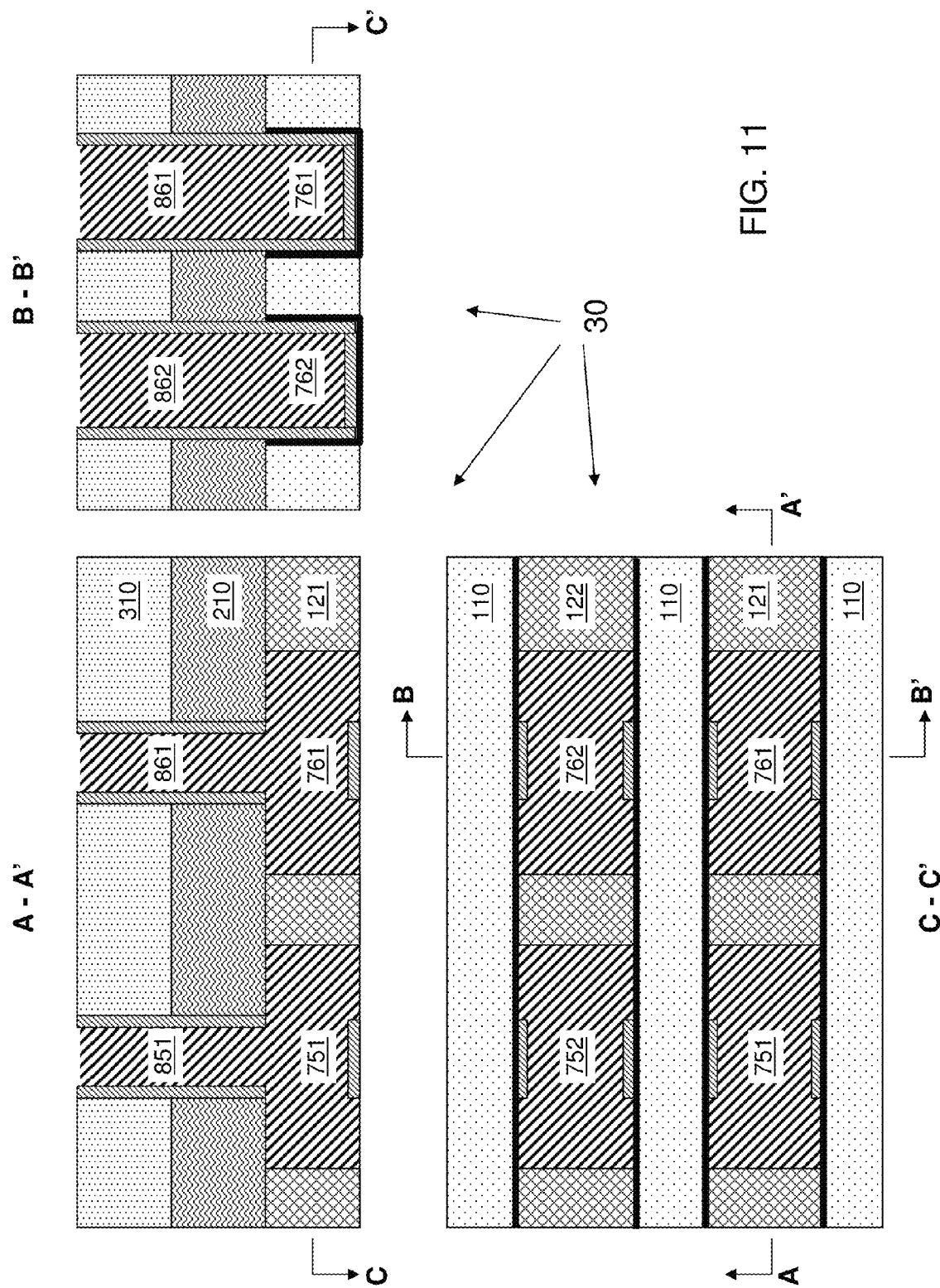

FIGS. 9-11 are demonstrative illustrations of steps of a method of forming self-aligned contact structure 30 according to yet another embodiment of present invention. More specifically, FIGS. 9-11 illustrate an embodiment that combines the advantages of embodiments illustrated in FIGS. 1-4 and in FIGS. 5-7 in forming self-aligned contact structure. For example, as being demonstratively illustrated in FIG. 9, when etching aluminum gates 121 and 122 in preparation for forming gate contacts, the etching process may be performed sufficiently such that aluminum materials of metal gates 121 and 122, in areas facing directly via openings and their immediate surroundings, may be removed substantially or almost completely. The etching thus may create open spaces 551, 552, 561, and 562. On the other hand, the etching may not be performed such that as to completely remove the entire gates 121 and 122, which may thus reduce the time of etching and reduce cycle of production. Here, it is assumed that interface areas of open spaces 551, 552, 561, and 562 with remaining portions of metal gates 121 and 122 are bigger than cross-section of via openings 451, 452, 461, and 462. Therefore, interfacial resistance at the interface with the remaining metal gates 121 and 122 may be reduced, compared with interfacial resistance that would otherwise be formed at the smaller via opening place.

Following the etching process of removing portions of gates 121 and 122, according to one embodiment, metal liners 651, 652, 661, and 662 may be deposited onto sidewalls of via openings 451, 452, 461, and 462 as well as areas in the open spaces 551, 552, 561, and 562 that face directly or substantially directly via openings 451, 452, 461, and 462, as being demonstratively illustrated in FIG. 10. Following the formation of metal liners 651, 652, 661, and 662, one embodiment includes performing metal fill in the via openings lined by metal liners 651, 652, 661, and 662 and in the underneath open spaces 551, 552, 561, and 562. The metal fill may be performed by an isotropic deposition process that substantially fills up the open spaces 551, 552, 561, and 562. More specifically as being demonstratively illustrated in FIG. 11, the metal fill process may create conductive segments 751, 752, 761, and 762 that, together with the remaining aluminum gates 121 and 122, become part of the metal gate. Metal deposition continues on top of conductive segments 751, 752, 761, and 762 that subsequently forms gate contacts 851, 852, 861, and 862 inside via openings 451, 452, 461, and 462.

FIGS. 12-13 are sample SEM pictures of self-aligned contact structures formed according to one or more embodiments of present invention. More specifically, 1201 in FIG. 12 is a SEM picture showing a fabricated contact structure cross-section that is similar to embodiment shown in cross-sectional view A-A' of FIGS. 11, and 1202 is similar to that shown in cross-sectional view B-B' of FIG. 11. Also for example, 1301 in FIG. 13 is a SEM picture showing a fabricated contact structure cross-section that is similar to embodiment shown in cross-sectional view A-A' of FIG. 11; 1302 shows a fabricated structure similar to that shown in cross-sectional view A-A' of FIG. 4; 1303 shows a fabricated structure similar to that shown in cross-sectional view B-B' of FIG. 8; and 1304 shows a fabricated structure similar to that shown in cross-sectional view A-A' of FIG. 8.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    forming a transistor structure having an aluminum gate and one or more inter-layer-dielectric (ILD) layers on top of said aluminum gate;
    creating one or more contact holes through said one or more ILD layers to expose said aluminum gate underneath said one or more ILD layers;
    causing said one or more contact holes to expand into said aluminum gate and horizontally into areas underneath said one or more ILD layers by applying an isotropic etching process to etch said exposed aluminum gate, said isotropic etching process being selective to said one or more ILD layers and leaving said one or more ILD layers substantially unaffected during said isotropic etching process; and
    filling said expanded contact holes with a conductive material.

2. The method of claim 1, wherein etching said exposed aluminum gate comprises causing a channel region of said transistor structure underneath said aluminum gate being exposed.

3. The method of claim 2, wherein etching said exposed aluminum gate comprises exposing said aluminum gate to a selective etching process with an etchant composition of an acid and an oxidant, wherein said etchant composition contains fluoride ion.

4. The method of claim 1, further comprising applying a metal liner to sidewalls of said contact holes inside said one or more ILD layers by a physical vapor deposition (PVD) process.

5. The method of claim 4, wherein applying said metal liner comprises applying a layer of material to sidewalls of said contact holes, said material being selected from a group consisting of titanium-nitride (TiN), titanium-tungsten (TiW), tantalum (Ta), tantalum-nitride (TaN), cobalt (Co), cobalt alloy, ruthenium (Ru), ruthenium alloy, and tungsten-nitride (WN).

6. The method of claim 1, wherein said conductive material filled into said expanded contact holes contact each other underneath said one or more ILD layers.

7. A method comprising:
    forming a semiconductor structure having a metal layer and one or more inter-layer-dielectric (ILD) layers on top of said metal layer;
    creating one or more via holes through said one or more ILD layers to expose said metal layer underneath said one or more ILD layers;
    causing said one or more via holes to expand into said metal layer and horizontally into areas underneath said one or more ILD layers by applying an isotropic etching process to etch said exposed metal layer, said isotropic etching process being selective to said one or more ILD layers and leaving said one or more ILD layers substantially unaffected during said isotropic etching process; and
    filling said expanded via holes with a conductive material.

8. The method of claim 7, wherein said isotropic etching process etches an oxide film on top of said exposed metal layer.

9. The method of claim 7, wherein etching said exposed metal layer comprises applying an etchant composition of sulfuric acid and hydrogen peroxide in said selective isotropic etching process.

10. The method of claim 9, wherein etching said exposed metal layer comprises causing a substantial amount of said metal layer being removed to expose a substantial portion of a non-metal layer underneath said metal layer.

11. The method of claim 7, further comprises applying a layer of lining material to said one or more via holes, said lining material being selected from a group consisting of titanium-nitride (TiN), titanium-tungsten (TiW), tantalum (Ta), tantalum-nitride (TaN), cobalt (Co), cobalt alloy, ruthenium (Ru), ruthenium alloy, and tungsten-nitride (WN).

12. The method of claim 7, wherein said conductive material is filled to contact remaining of said metal layer underneath said one or more ILD layers, said conductive material forming an interface with said remaining of said metal layer, said interface having an area being larger than a horizontal cross section of one of said one or more via holes.

13. The method of claim 7, wherein said conductive material inside said expanded one or more via holes contact each other underneath said one or more ILD layers.

14. The method of claim 7, wherein said metal layer is a metal gate of aluminum of a transistor and wherein said conductive material is copper forming an interface with remaining aluminum of said metal gate underneath said one or more ILD layers.

15. A method comprising:
forming a semiconductor structure having a first metal layer and a plurality of inter-layer-dielectric (ILD) layers on top of said first metal layer;
creating one or more openings through said plurality of ILD layers to expose said first metal layer underneath said plurality of ILD layers;
causing said one or more openings to expand downward into said first metal layer and expand horizontally into areas underneath said plurality of ILD layers by applying an isotropic etching process to etch said exposed first metal layer, said isotropic etching process being selective to said plurality of ILD layers and leaving said plurality of ILD layers substantially unaffected during said isotropic etching process;
lining sidewalls of said one or more openings inside said plurality of ILD layers; and
filling said expanded one or more openings with a conductive material.

16. The method of claim 15, wherein etching said exposed first metal layer comprises etching said first metal layer in said isotropic etching process until a non-metal layer directly underneath said first metal layer is at least partially exposed.

17. The method of claim 16, wherein etching said exposed first metal layer comprises subjecting said exposed first metal layer to an etchant composition of an acid and an oxidant of a single species.

18. The method of claim 15, wherein said expanded one or more openings comprises a first expanded opening and a second expanded opening, said first and second expanded openings are both partially below said plurality of ILD layers and are separated by a remaining portion of said first metal layer.

19. The method of claim 15, wherein lining said sidewalls comprises applying a lining material to said sidewalls, said lining material being one of titanium-nitride (TiN), titanium-tungsten (TiW), tantalum (Ta), tantalum-nitride (TaN), cobalt (Co), cobalt alloy, ruthenium (Ru), ruthenium alloy, and tungsten-nitride (WN).

20. The method of claim 15, wherein said conductive material is formed directly on top of a remaining portion of said first metal layer underneath said plurality of ILD layers, said conductive material forming an interface with said remaining portion of said first metal layer, said interface being larger than a horizontal cross-section of one of said one or more openings inside said plurality of ILD layers.

21. The method of claim 15, wherein said conductive material fills said expanded one or more openings to form one or more interconnects that contact each other underneath said plurality of ILD layers.

* * * * *